(12) United States Patent
Bennett

(10) Patent No.: US 11,189,463 B2
(45) Date of Patent: Nov. 30, 2021

(54) PLASMA GENERATING ARRANGEMENT

(71) Applicant: SPTS TECHNOLOGIES LIMITED, Newport (GB)

(72) Inventor: Paul Bennett, Bristol (GB)

(73) Assignee: SPTS TECHNOLOGIES LIMITED, Newport (GB)

(*) Notice: Subject to any disclaimer, the term of this patent is extended or adjusted under 35 U.S.C. 154(b) by 0 days.

(21) Appl. No.: 16/284,649

(22) Filed: Feb. 25, 2019

(65) Prior Publication Data

US 2019/0333740 A1    Oct. 31, 2019

(30) Foreign Application Priority Data

Apr. 25, 2018    (GB) .................................... 1806783

(51) Int. Cl.
*H01J 37/32*    (2006.01)

(52) U.S. Cl.
CPC ..... *H01J 37/32183* (2013.01); *H01J 37/3211* (2013.01); *H01J 37/32899* (2013.01); *H01J 2237/327* (2013.01)

(58) Field of Classification Search
None
See application file for complete search history.

(56) References Cited

U.S. PATENT DOCUMENTS

| | | | |
|---|---|---|---|
| 5,433,813 A * | 7/1995 | Kuwabara | C23C 14/54 118/666 |
| 5,733,511 A | 3/1998 | De Francesco | |
| 6,264,812 B1 | 7/2001 | Raaijmakers et al. | |
| 9,721,759 B1 | 8/2017 | Karlquist et al. | |
| 2002/0189763 A1 | 12/2002 | Kwon et al. | |
| 2008/0050292 A1* | 2/2008 | Godyak | H01J 37/3255 422/186.29 |
| 2012/0306367 A1 | 12/2012 | Kim et al. | |
| 2013/0196080 A1 | 8/2013 | Cho | |
| 2014/0312766 A1 | 10/2014 | Carducci et al. | |
| 2018/0018418 A1* | 1/2018 | Valcore, Jr. | G06F 30/36 |

OTHER PUBLICATIONS

EPO, EESR for EP 19160072.5, dated Sep. 11, 2019.

* cited by examiner

*Primary Examiner* — Amy Cohen Johnson
*Assistant Examiner* — Jianzi Chen
(74) *Attorney, Agent, or Firm* — Hodgson Russ LLP

(57) ABSTRACT

A plasma generating arrangement includes a plurality of plasma sources, each plasma source including a respective antenna coil assembly electrically coupled to a common electrical terminal via a respective transmission line. Each transmission line is configured to communicate a radio frequency electrical power signal from the common electrical terminal to the respective antenna coil assembly, and has a length which is an odd multiple of ¼ of the wavelength of the radio frequency electrical power signal.

20 Claims, 4 Drawing Sheets

(a)

(b)

PLASMA GENERATING ARRANGEMENT

BACKGROUND

The present invention relates to a plasma generating arrangement.

It is well known that a plasma may be generated within a low pressure plasma chamber by passing a radio frequency current through an antenna disposed proximate the process chamber. The antenna can either be within or outside the vacuum vessel depending on the plasma process requirement. This type of plasma can be used to etch, deposit or treat surfaces in the proximity of the plasma. The rapidly changing electrical current generates a magnetic field which interacts with a gas within the chamber to generate a plasma. So-called inductively coupled plasmas typically comprise one or more radio frequency (RF) electrical power sources per chamber (even more if more than one RF frequency is required for the process) for generating an electrical current in a respective antenna. Each RF power source is impedance matched with the antenna through the use of an RF matching network. The necessity to use dedicated RF power supplies and matching networks for each antenna places constraints on the system designer. It would be desirable to be able to share an RF power supply operating at a fixed frequency, for example 13.56 MHz, with multiple antennas to simplify system design, save space and reduce cost.

In practice when two or more RF antenna 10a, 10b that are used as the excitation means for a low pressure process chamber 15 are coupled in parallel with a single RF power supply 20, as represented in FIG. 1b, then the magnetic fields generated will be out-of-phase and one of the coils 10a, 10b will become dominant and draw all the electrical power from the source. This manifests as a plasma 25 forming local to the dominant coil, however, it is difficult to predict which coil will draw the power to create the plasma. The coil which becomes dominant may be determined by slight differences in the mechanical layout or gas conditions, although this is typically a random process. A similar result would occur if two or more separate chambers were driven in parallel from a single RF power supply.

Operating multiple antenna in series in close proximity on a single chamber 15 for example is of limited benefit as the generated electromagnetic fields interact. Referring to FIG. 1a for example, if two coils 10a, 10b are placed on the same chamber 15 in close proximity and configured in a series configuration, then the magnetic fields generated will be in-phase, and the plasma will form stably mid-way between the coils 10a, 10b.

SUMMARY

We have now devised an improved plasma generating arrangement which alleviates at least some of the above mention problems.

In accordance with the present invention, there is provided a plasma generating arrangement comprising a plurality of plasma sources, each plasma source comprising a respective antenna coil assembly electrically coupled to a common electrical terminal via a respective transmission line, each transmission line being configured to communicate a radio frequency electrical power signal from the common electrical terminal to the respective antenna coil assembly, wherein each transmission line comprises a length which is an odd multiple of ¼ of the wavelength of the radio frequency electrical power signal.

The plasma generating arrangement forces the sharing of electrical power to each plasma source, so that each source can generate a stable plasma local to their respective position on a plasma chamber.

In an embodiment, each transmission line comprises a length which is substantially one quarter of one wavelength of the radio frequency electrical power signal.

In an embodiment, each plasma source is electrically connected together in a parallel configuration.

In an embodiment, at least one transmission line of the arrangement comprises an impedance matching circuit for matching an electrical impedance of the respective antenna coil assembly with the common electrical terminal. The impedance matching circuit may comprise inductors and capacitors. The inductors and capacitors may be configured to a π-network configuration. In an embodiment, the impedance matching circuit comprises a quarter-wave impedance transformer.

In an embodiment, each transmission line of the arrangement comprises an impedance matching circuit for matching an electrical impedance of the respective antenna coil assembly with the common electrical terminal. Each impedance matching circuit may comprise inductors and capacitors, which may be configured to a π-network configuration.

In an embodiment, each transmission line may further comprise a feedline, such as a coaxial cable, for communicating the electrical power signal to the respective antenna coil assembly. The feedline may be disposed between the respective impedance matching circuit and the antenna coil assembly.

In an embodiment, each antenna coil assembly comprises an antenna coil and an electrical resonator circuit. The electrical resonator circuit comprises a capacitor electrically coupled in a parallel configuration with the respective antenna coil. The antenna coil may be disposed on a common plasma chamber for generating separate plasmas within the same chamber, localised to each coil. Alternatively, the antenna coils may be disposed on separate plasma chambers for generating a plasma within each separate chamber.

In an embodiment, the arrangement further comprises a radio frequency electrical power supply for supplying radio frequency electrical power to the common electrical terminal. Accordingly, a single electrical power supply can be used to electrically power a number of separate plasma sources.

In an embodiment, the arrangement comprises a further impedance matching circuit for matching an electrical impedance of the common electrical terminal to the radio frequency electrical power supply.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments.

Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

BRIEF DESCRIPTION OF THE DRAWINGS

The invention may be performed in various ways and by way of example only, embodiments thereof will now be described with reference to the accompanying drawings, in which.

DETAIL DESCRIPTION OF EMBODIMENTS

Figure 1:
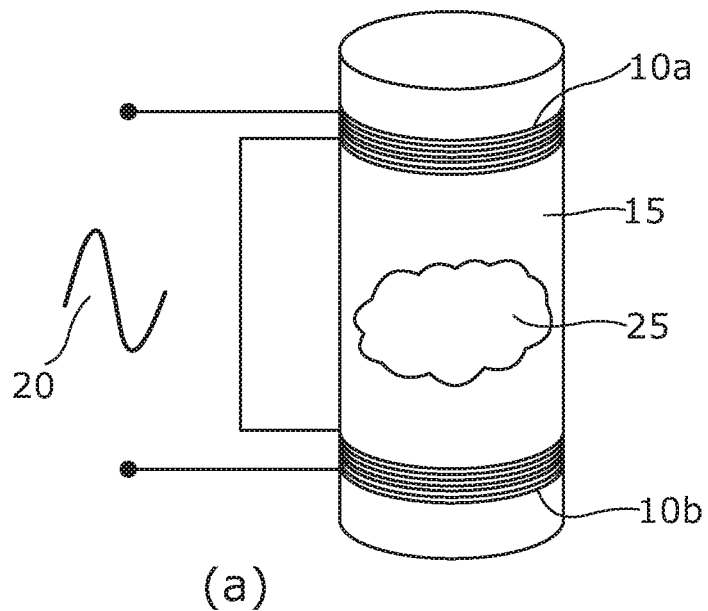
FIG. 1 is a schematic illustration of a known plasma generating arrangement comprising two antenna coils for generating a plasma within a plasma chamber, the antennas being arranged in (a) a series configuration, and (b) a parallel configuration.
Figure 1:
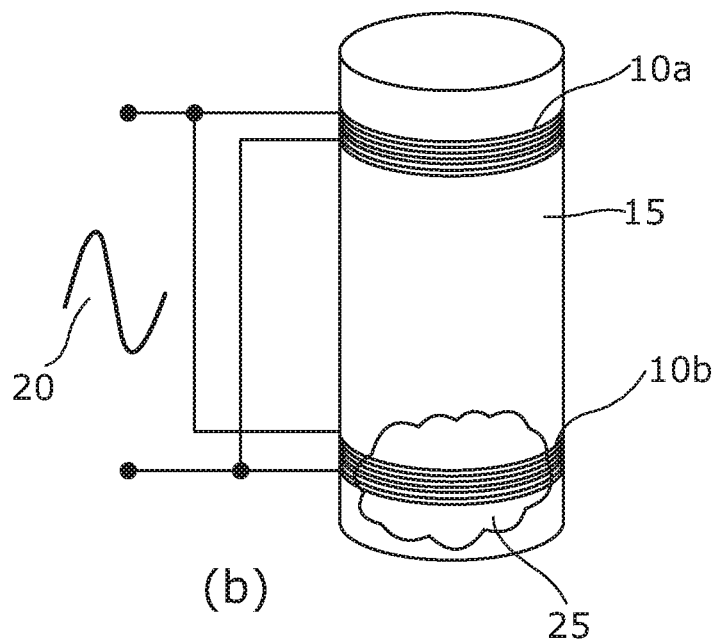
Figure 2:
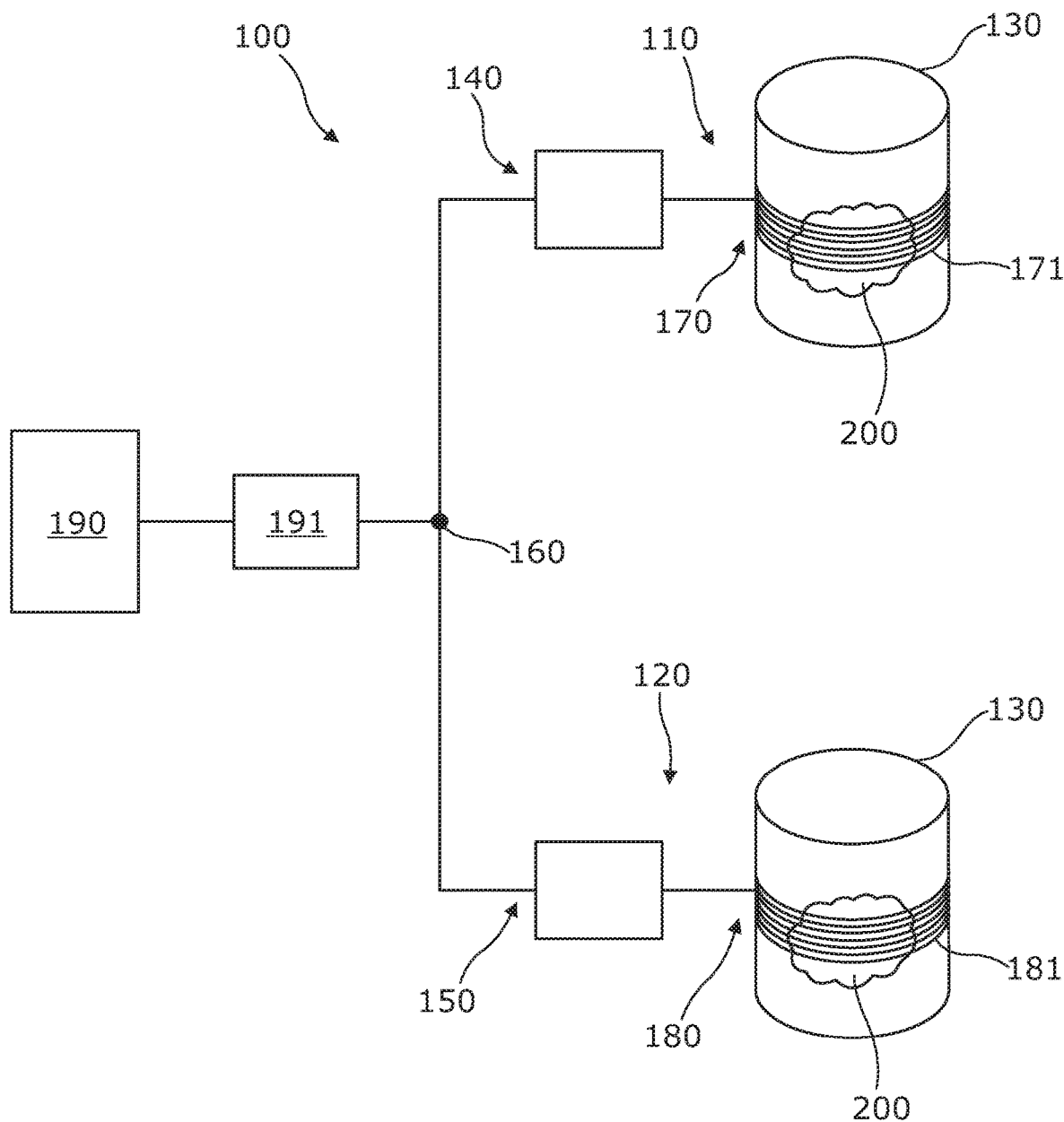
FIG. 2 is a schematic illustration of a plasma generating arrangement according to an embodiment of the present invention.

Referring to FIG. 2 of the drawings, there is provided a schematic illustration of a plasma generating arrangement 100 according to an embodiment of the present invention. The illustrated arrangement comprises two plasma sources 110, 120, each associated with a separate plasma chamber 130, such as a plasma tube containing a gas such as nitrogen. However, each plasma source may instead be associated with a common plasma chamber. Moreover, while the illustrated embodiment only comprises two plasma sources, it is to be appreciated that the arrangement may be scaled up to include further plasma sources operating form a single RF power supply.

The plasma sources 110, 120 are electrically coupled in a parallel configuration via a respective transmission line 140, 150. Each transmission line 140, 150 is electrically connected at one end to a common electrical terminal 160 or node and at the other end to a respective antenna coil assembly 170, 180 each being arranged to electromagnetically induce a plasma 200 within a chamber 130, local to the coil 170, 180. The plasma sources 110, 120 and thus the antenna coil assemblies 170, 180 are electrically powered using a radio frequency (RF) electrical power source 190 which is electrically coupled to the common node 160. In this respect, a single RF power source 190 is configured to power a plurality of plasma sources 110, 120.

The transmission lines 140, 150 coupling the antenna coil assemblies 170, 180 to the common node 160 are sized to correspond with an odd multiple of ¼ of the wavelength of the electrical power signal from the RF source 190, and in a preferred embodiment, each transmission line 140, 150 comprises an effective path length which is substantially one quarter of one wavelength of the electrical power signal to create a phase change of $\pi/2$ radians in traversing the transmission line 140, 150. Generally plasma sources have a negative resistance characteristic and so if plasma sources are placed in a parallel configuration, positive feedback results in one of the coils receiving all the electrical power and becoming dominant, at the expense of the other coils. However, by electrically coupling each antenna coil assembly 170, 180 to a common electrical node 160 so that each assembly 170, 180 is one quarter of one wavelength from the node 160, then this effectively causes the coils 170, 180 to behave as if arranged in an electrically series configuration. In this case, the effective input impedance (Z) of the transmission line 140, 150 can be expressed as $Z=Z_0^2/Z_L$, where $Z_0$ is the characteristic impedance of the transmission line and $Z_L$ is the impedance of the respective antenna coil assembly 170, 180. Accordingly, if a plasma associated with a particular plasma source 110, 120 of the arrangement begins to extinguish, then $Z_L$ will begin to increase causing the effective impedance of the transmission line 140, 150 to decrease. The decreased impedance results in electrical power being drawn away from the other plasma source(s) to maintain the plasma, and so providing a stabilising negative feedback.

In order to maximise the electrical coupling of the power from the transmission line 140, 150 to the respective antenna coil assembly 170, 180, the impedance of the transmission line 140, 150 must be matched to the impedance of the respective antenna coil assembly 170, 180. The characteristic impedance of a coaxial cable transmission line is typically 50) and so provided the antenna coil assembly 170, 180 comprises a similar impedance, then the electrical power reflected at the coupling with the respective antenna coil assembly 170, 180 will be minimised. At 13.56 MHz, a common RF frequency used in plasma reactors, a ¼ wavelength is approximately 4 m. However, if the antenna coil assembly 170, 180 comprises an impedance which differs markedly from the transmission line 140, 150 or a shorter cable length is required, then the shorter cable can be combined with a "lumped" equivalent circuit of a coaxial cable using a low pass $\pi$-network or circuit, as illustrated in FIG. 3 of the drawings, in order to tailor the impedance of the transmission line.

Figure 3:
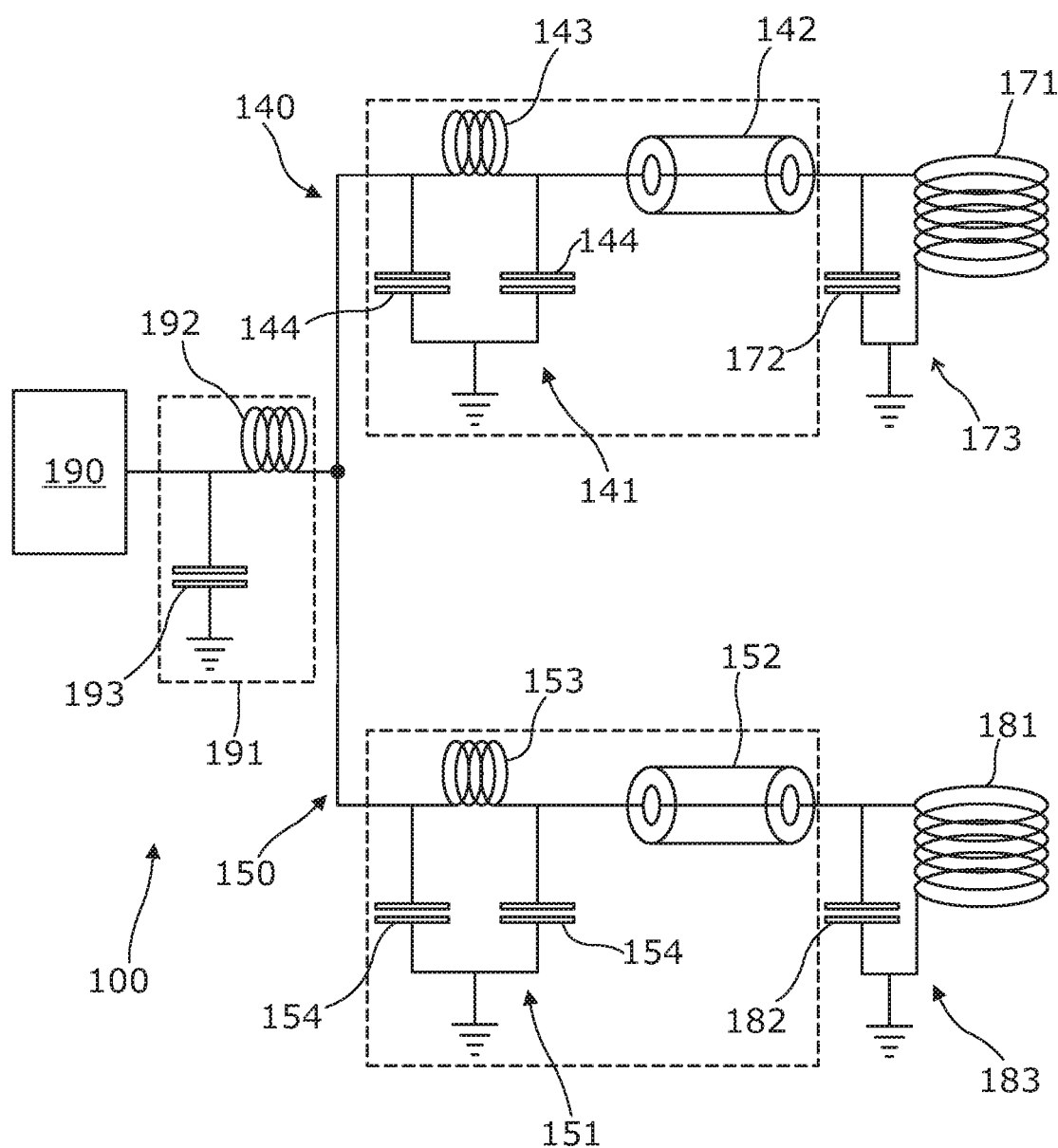
FIG. 3 is a circuit diagram illustrating electrical components of the embodiment illustrated in FIG. 2, with the plasma chambers removed.

Referring to FIG. 3 of the drawings for example, each transmission line 140, 150 comprises a series configuration of a $\pi$-network 141, 151 and a feedline 142, 152, such as coaxial cable, for coupling electrical power from the common node 160 to the respective antenna coil assembly 170, 180. The $\pi$-network 141, 151 comprises an inductor 143, 153 arranged in series with the feedline 142, 152 and two capacitors 144, 154 separately arranged in a parallel configuration either side of the inductor 143, 153. In situations where the antenna coil assembly 170, 180 comprises an impedance which is mismatched with the transmission line 140, 150, then effective impedance of the transmission line 140, 150 (namely the combined impedance of the $\pi$-network 141, 151 and feedline 142, 152) can be selected by choosing the appropriate inductance and capacitance values for the inductor 143, 153 and capacitors 144, 154, respectively.

Each antenna coil assembly 170, 180 comprises a coupling coil 171, 181 which extends in close proximity to a plasma chamber 130, such as a plasma tube, or may be disposed upon the chamber 130 and tuned to parallel resonance by a respective capacitor 172, 182 of an associated electrical resonator circuit 173, 183. The one quarter wavelength transmission line 140, 150 is formed by the respective $\pi$-network 141, 151 and feedline 142, 152 and is arranged to generate a $\pi/2$ radian phase shift across the line. The phase shift across the feedline 142, 152 is defined as Length/ (wavelength×feedline velocity factor). For a typical feedline, such as RG213, the velocity factor, Vp, is 0.66. Accordingly, a 1 m long RG213 feedline supporting an electrical signal at a frequency (f) of 13.56 MHz will generate a phase shift of 24° (approximately $2\pi/15$ radians). The remaining phase shift required from the $\pi$-network to create the 90° shift, is therefore 66°.

For a low pass $\pi$-network, the inductance (L) is defined as $(Z_0 \sin \delta)/\omega$, where $\omega=2\pi f$ is the angular frequency and the capacitance (C) for each capacitor is $(1-\cos\theta)/\omega Z_0 \sin\theta$. Therefore, in order to generate a further phase shift of 66° the required inductance and capacitance values for the inductor and capacitors are calculated as 532 nH and 150 pF, respectively.

The RF power source 190 is further impedance matched to the common node 160 via a respective impedance matching circuit 191 which comprises an inductor 192 and capacitor 193. The inductor 192 is coupled in a series configuration with the RF power source 190 and common node 160 whereas the capacitor 193 is coupled in a parallel configuration, between the RF source 190 and the inductor 192.

The invention was tested in practice using 2 parallel cylindrical water cooled plasma tubes made of $Al_2O_3$ with similar multi-turn coil antennas. This is schematically represented in FIG. 2. Both plasma sources 110, 120 were fed from a single 13.56 MHz power supply operated at ~2 kW at 4 Torr pressure of N2 using a common pump. Voltage was monitored using an oscilloscope.

Figure 4:
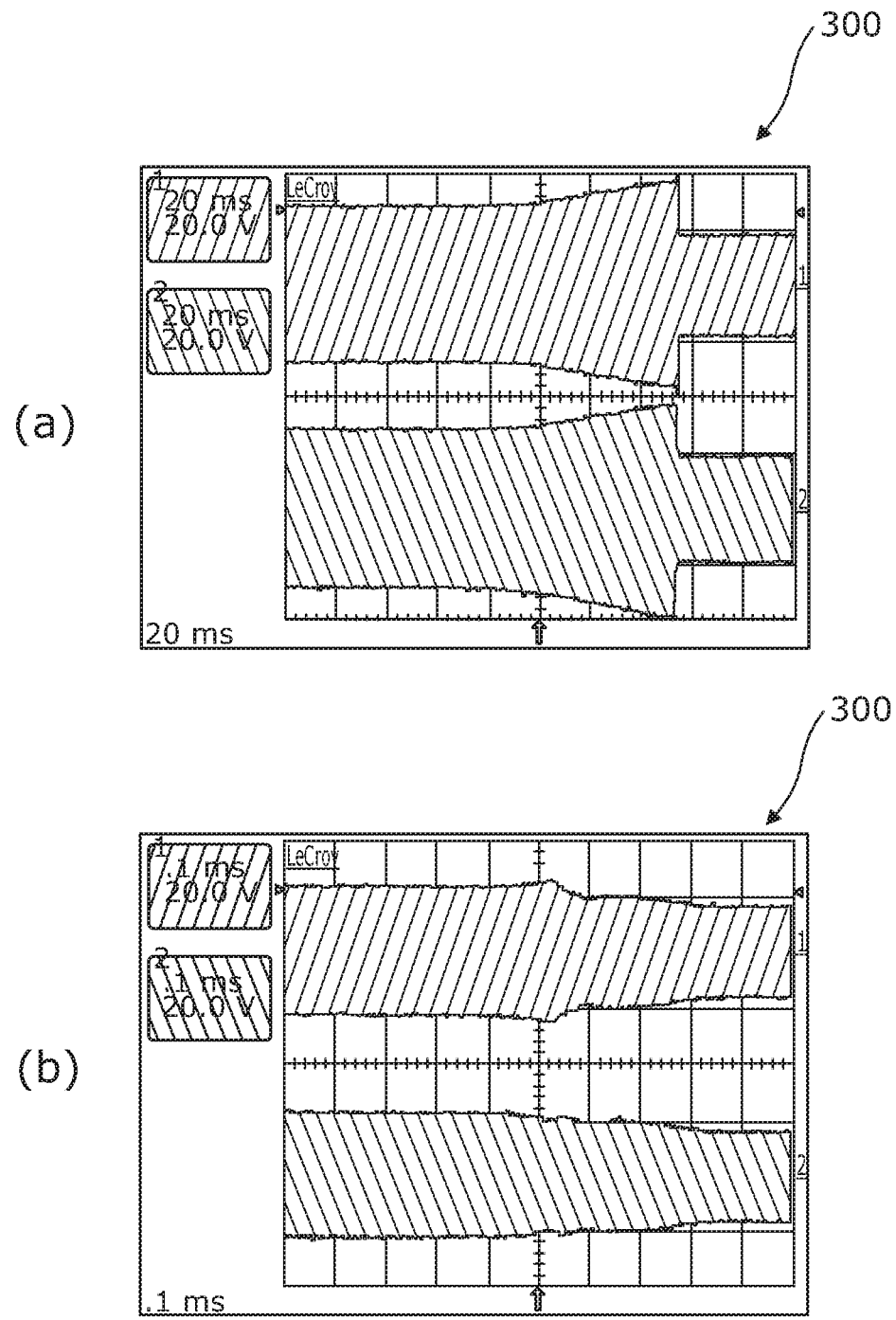
FIG. 4 is a view of an instrument display showing the variation in voltage across each plasma source as a function of time, during an ignition of a plasma, where (a) the time graticules represent 20 ms divisions, and (b) the time graticules represent 1 ms divisions.

Referring to FIG. 4 of the drawings, there is illustrated an instrument display 300 showing the variation in voltage across each plasma source as a function of time. FIGS. 4a and 4b illustrate the voltage across each plasma source 110, 120 during a plasma ignition sequence. FIG. 4a illustrates the voltage variation on a relatively course timescale (20 ms/div) and from this figure it is evident that both plasma sources 110, 120 generate a respective plasma at nearly the same time, as indicated by the sudden drop in voltage. FIG. 4b provides a closer inspection of the voltage variation at the ignition point using a relatively smaller timescale (1 ms/div). On this scale it is evident that the voltage across the second plasma source 120 (lower trace in FIGS. 4a and 4b) falls and the voltage across the first plasma source 110 rises, as the second source 120 ignites a plasma first. Shortly after the ignition of the plasma by second source 120, the voltage across the first source 110 rises until the plasma also ignites proximate the first source 110, thereby demonstrating the generation of two stable plasmas (in the same chamber 130 or in separate chambers) using a single power source 190.

From the foregoing therefore, it is evident that the plasma generating arrangement provides a simple yet effective arrangement for generating multiple plasmas from a single power source.

What is claimed is:

1. A plasma generating arrangement comprising a plurality of inductively coupled plasma (ICP) sources, each ICP source comprising an antenna coil assembly disposed on and around a sidewall of a plasma chamber that connects a top wall and a bottom wall of the plasma chamber, wherein the plasma chamber is defined by the top wall, the bottom wall, and the sidewall, wherein the antenna coil assembly induces a plasma that is contained entirely within an interior of the plasma chamber between the top wall and the bottom wall and within the antenna coil assembly, and wherein each ICP source is electrically coupled to a common electrical terminal via a respective transmission line, each transmission line being configured to communicate a radio frequency electrical power signal from the common electrical terminal to the respective antenna coil assembly, wherein each transmission line comprises a length which is an odd multiple of ¼ of the wavelength of the radio frequency electrical power signal.

2. A plasma generating arrangement according to claim 1, wherein each transmission line comprises a length which is substantially one quarter of one wavelength of the radio frequency electrical power signal.

3. A plasma generating arrangement according to claim 1, wherein each ICP source is electrically connected together in a parallel configuration.

4. A plasma generating arrangement according to claim 1, wherein at least one transmission line of the arrangement comprises an impedance matching circuit for matching an electrical impedance of the respective antenna coil assembly with the common electrical terminal.

5. A plasma generating arrangement according to claim 4, wherein the impedance matching circuit comprises inductors and capacitors.

6. A plasma generating arrangement according to claim 5, wherein the inductors and capacitors are configured to a n-network configuration.

7. A plasma generating arrangement according to claim 1 wherein each transmission line of the arrangement comprises an impedance matching circuit for matching an electrical impedance of the respective antenna coil assembly with the common electrical terminal.

8. A plasma generating arrangement according to claim 1, wherein each transmission line further comprises a feedline for communicating the electrical power signal to the respective antenna coil assembly.

9. A plasma generating arrangement according to claim 8, wherein the feedline is disposed between the respective impedance matching circuit and the antenna coil assembly.

10. A plasma generating arrangement according to claim 1, wherein each antenna coil assembly comprises an antenna coil and an electrical resonator circuit.

11. A plasma generating arrangement according to claim 10, wherein the electrical resonator circuit comprises a capacitor electrically coupled in a parallel configuration with the respective antenna coil.

12. A plasma generating arrangement according to claim 10, wherein each of the antenna coil assemblies is disposed around the plasma chamber for generating separate plasmas within the plasma chamber, localised to each coil.

13. A plasma generating arrangement according to claim 10, further comprising a plurality of the plasma chambers, wherein each of the antenna coil assemblies is disposed around a separate one of the plasma chambers for generating a plasma within the interior of each of the plasma chambers.

14. A plasma generating arrangement according to claim 1, further comprising a radio frequency electrical power supply for supplying radio frequency electrical power to the common electrical terminal.

15. A plasma generating arrangement according to claim 14, further comprising an impedance matching circuit for matching an electrical impedance of the common electrical terminal to the radio frequency electrical power supply.

16. A plasma generating arrangement according to claim 1, further comprising a plurality of the plasma chambers, wherein each of the antenna coil assemblies is disposed around a separate one of the plasma chambers for generating a plasma within the interior of each of the plasma chambers.

17. A plasma generating arrangement according to claim 1, wherein the antenna coil assembly is outside the plasma chamber.

18. A plasma generating arrangement according to claim 1, wherein a diameter of the antenna coil assembly is larger than a diameter of the sidewall.

19. A plasma generating arrangement comprising a plurality of plasma sources, each plasma source comprising a respective antenna coil assembly disposed on and around a sidewall of a plasma chamber that connects a top wall and a bottom wall of the plasma chamber, wherein the plasma chamber is defined by the top wall, the bottom wall, and the sidewall, wherein the antenna coil assembly induces a plasma that is contained entirely within an interior of the plasma chamber between the top wall and the bottom wall and within the antenna coil assembly, and wherein each ICP source is electrically coupled to a common electrical terminal via a respective transmission line, each transmission line being configured to communicate a radio frequency electrical power signal from the common electrical terminal to the respective antenna coil assembly, wherein each transmission line comprises a length which is an odd multiple of ¼ of the wavelength of the radio frequency electrical power signal, wherein each transmission line of the arrangement comprises an impedance matching circuit for matching an electrical impedance of the respective antenna coil assembly with the common electrical terminal.

20. A plasma generating arrangement comprising a plurality of plasma sources, each plasma source comprising a respective antenna coil assembly electrically coupled to a common electrical terminal via a respective transmission line, each transmission line being configured to communicate a radio frequency electrical power signal from the common electrical terminal to the respective antenna coil assembly, wherein each transmission line comprises a length which is an odd multiple of ¼ of the wavelength of the radio frequency electrical power signal, wherein each antenna coil assembly comprises an antenna coil and an electrical resonator circuit, and further comprising a plurality of plasma chambers, wherein each antenna coil is disposed on and around a sidewall of a separate plasma chamber that connects a top wall and a bottom wall of the plasma chamber for generating a plasma that is contained entirely within an interior of the plasma chambers between the top wall and the bottom wall whereby the plasma is within the antenna coil, wherein each of the plasma chambers is defined by the top wall, the bottom wall, and the sidewall.

* * * * *